(12) United States Patent
Nakamura (10) Patent No.: US 11,660,678 B2
(45) Date of Patent: May 30, 2023

(54) COATED CUTTING TOOL

(71) Applicant: TUNGALOY CORPORATION, Fukushima (JP)

(72) Inventor: Takaaki Nakamura, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 0 days.

(21) Appl. No.: 17/349,721

(22) Filed: Jun. 16, 2021

(65) Prior Publication Data

US 2021/0402487 A1 Dec. 30, 2021

(30) Foreign Application Priority Data

Jun. 24, 2020 (JP) .............................. JP2020-108341

(51) Int. Cl.
| | |
|---|---|
| *B32B 15/04* | (2006.01) |
| *B32B 17/06* | (2006.01) |
| *B23B 27/14* | (2006.01) |
| *C22C 29/08* | (2006.01) |
| *C23C 14/06* | (2006.01) |
| *C23C 14/32* | (2006.01) |
| *B23C 5/16* | (2006.01) |

(Continued)

(52) U.S. Cl.
CPC .............. *B23B 27/148* (2013.01); *B23C 5/16* (2013.01); *C22C 29/08* (2013.01); *C23C 14/0617* (2013.01); *C23C 14/0641* (2013.01); *C23C 14/32* (2013.01); *C23C 28/044* (2013.01); *C23C 28/42* (2013.01); *C23C 28/44* (2013.01); *B23B 2224/24* (2013.01); *B23B 2228/105* (2013.01)

(58) Field of Classification Search
CPC ......... B23C 5/16; B23B 27/14; B23B 27/148; B23B 2228/105; C23C 14/0641

USPC ......................................... 428/697, 698, 699
See application file for complete search history.

(56) References Cited

U.S. PATENT DOCUMENTS

| | | | | |
|---|---|---|---|---|
| 2010/0017499 | A1* | 1/2010 | Martinent | ............. H04W 8/245 |
| | | | | 709/219 |
| 2016/0001374 | A1* | 1/2016 | Zhu | ..................... C23C 14/0664 |
| | | | | 407/115 |
| 2019/0040519 | A1* | 2/2019 | Sato | ........................ C23C 14/48 |

FOREIGN PATENT DOCUMENTS

| | | |
|---|---|---|
| JP | 2002-263941 A | 9/2002 |
| JP | 2010-115740 A | 5/2010 |
| JP | 2019-155570   * | 9/2019 |

* cited by examiner

*Primary Examiner* — Lauren R Colgan (74) *Attorney, Agent, or Firm* — Studebaker & Brackett PC

(57) ABSTRACT

A coated cutting tool comprises a substrate and a coating layer formed on a surface of the substrate, and has a rake face and a flank. The coating layer comprises an alternating laminate structure in which first compound layers containing AlN and second compound layers containing a compound are laminated in an alternating manner, the compound having a composition represented by formula (1) below:

$$(Ti_{1-x}Al_x)N \qquad (1)$$

(wherein x satisfies $0.40 \leq x \leq 0.70$). An average thickness $T_1$ per first compound layer is 5 nm or more to 160 nm or less, and an average thickness $T_2$ per second compound layer is 8 nm or more to 200 nm or less. A ratio of $T_1$ to $T_2$ is 0.10 or more to 0.80 or less. An average thickness $T_3$ of the alternating laminate structure is 2.5 μm or more to 7.0 μm or less. A ratio (H/E) of hardness H to elastic modulus E is 0.065 or more to 0.085 or less at the rake face or the flank.

21 Claims, 1 Drawing Sheet

(51) Int. Cl.
*C23C 28/00* (2006.01)
*C23C 28/04* (2006.01)

COATED CUTTING TOOL

CROSS-REFERENCES TO RELATED APPLICATIONS

This application relates to and claims priority from Japanese Patent Application No. 2020-108341 on (Jun. 24, 2020), the entire disclosure of which is incorporated herein by reference.

BACKGROUND OF THE INVENTION

Field of the Invention

The present invention relates to a coated cutting tool.

Description of Related Art

Cutting tools made of a cemented carbide or a cubic boron nitride sintered body (cBN) have been widely used for cutting of steel or other metal. In particular, a surface-coated cutting tool that has one or more hard coating films, such as a TiN layer and a TiAlN layer, on a surface of a cemented carbide substrate is widely used for various types of machining because of its high versatility.

For example, Japanese Patent Application Laid-open No. 2010-115740 (JP-A-2010-115740) discloses a surface-coated cutting tool that includes a substrate and a coating film formed on the substrate. The coating film includes two or more layers A made of AlN and two or more layers B made of $Ti_{1-x}Al_xN$ ($0.3 \leq x \leq 0.7$) laminated in an alternating manner. Thickness λa of the layer A and thickness λb of the layer B are each 2 nm or more to 1000 nm or less. A thickness ratio λa/λb gradually increases from the substrate side to the uppermost surface of the coating film. The thickness ratio λa/λb of the layers A and B closest to the substrate is 0.1 or more to 0.7 or less, and the thickness ratio λa/λb of the layers A and B closest to the uppermost surface is 1.5 or more to 10 or less.

SUMMARY

Milling of cast iron and other materials has tended toward higher speeds and higher feed rates in recent years, and the cutting conditions has become more severe than in the past. In such machining, a crack, especially a thermal crack, is likely to occur on a tool surface due to a mechanical load on a cutting edge and/or a drastic change in edge temperature, which tends to invite the occurrence of fractures in the tools due to propagation of the crack into the substrate. Cutting tools are therefore required to have higher wear resistance and higher fracture resistance than in the related art to prolong its tool life.

Unfortunately, as a result of detailed examination on conventional cutting tools, including the one described in JP-A-2010-115740, the inventor of the present invention has found that at least one of the wear resistance and fracture resistance of the conventional cutting tools is insufficient. For example, the cutting tool described in JP-A-2010-115740 does not exhibit a sufficient effect of suppressing thermal cracking, and thus has insufficient wear resistance and insufficient fracture resistance.

The present invention has been made in view of the above-described circumstances, and it is an object of the present invention to provide a coated cutting tool having a long tool life with improved wear resistance and fracture resistance.

Through repeated study on prolongation of the tool life of a coated cutting tool, the inventor has found that a coated cutting tool having a specific configuration can improve the wear resistance and fracture resistance, resulting in prolongation of the tool life, and have achieved the present invention.

Namely, the gist of the present invention is as set forth below.

[1] A coated cutting tool, comprising:
a substrate; and a coating layer formed on a surface of the substrate, and
the coated cutting tool having a rake face and a flank,
the coating layer comprising an alternating laminate structure in which first compound layers containing AlN and second compound layers containing a compound are laminated in an alternating manner, the compound having a composition represented by formula (1) below:

$$(Ti_{1-x}Al_x)N \qquad (1)$$

(wherein x denotes an atomic ratio of Al element to a total of Ti element and Al element and satisfies $0.40 \leq x \leq 0.70$),
an average thickness $T_1$ per first compound layer being 5 nm or more to 160 nm or less,
an average thickness $T_2$ per second compound layer being 8 nm or more to 200 nm or less,
a ratio ($T_1/T_2$) of the average thickness $T_1$ to the average thickness $T_2$ being 0.10 or more to 0.80 or less,
an average thickness $T_3$ of the alternating laminate structure being 2.5 μm or more to 7.0 μm or less,
a ratio (H/E) of hardness H to elastic modulus E being 0.065 or more to 0.085 or less at the rake face or the flank.

[2] The coated cutting tool according to [1], wherein hardness $H_2$ at the flank is larger than hardness $H_1$ at the rake face.

[3] The coated cutting tool according to [2], wherein a difference ($H_2-H_1$) between the hardness $H_2$ and the hardness $H_1$ is 0.5 GPa or more to 1.5 GPa or less.

[4] The coated cutting tool according to [2] or [3], wherein the hardness $H_1$ is 28.0 GPa or more to 35.0 GPa or less, and
the hardness $H_2$ is 28.5 GPa or more to 36.0 GPa or less.

[5] The coated cutting tool according to any one of [1] to [4], wherein the second compound layers contain cubic crystals of (Ti, Al)N, and has a full width at half maximum of 0.5° or more to 2.0° or less of a diffraction peak of a plane (200) of the cubic crystals measured by X-ray diffraction measurement.

[6] The coated cutting tool according to any one of [1] to [5], wherein
the coating layer comprises an upper layer on a surface of the alternating laminate structure on a side opposite to the substrate,
the upper layer is a single or multiple compound layers of: at least one element selected from the group consisting of Ti, Zr, Hf, V, Nb, Ta, Cr, Mo, W, Al, Si, and Y; and at least one element selected from the group consisting of C, N, O, and B, and
an average thickness of the upper layer is 0.1 μm or more to 3.0 μm or less.

[7] The coated cutting tool according to any one of claims [1] to [6], wherein
an average thickness $T_4$ of the coating layer is 2.5 μm or more to 9.0 μm or less, and
a ratio of the average thickness $T_3$ to the average thickness $T_4$ is 0.7 or more to 1.0 or less.

[8] The coated cutting tool according to any one of [1] to [7], wherein the substrate is a cemented carbide, cermet, ceramics, or a cubic boron nitride sintered body.

According to the present invention, there is provided a coated cutting tool improved in wear resistance and fracture resistance and having a long tool life.

DETAILED DESCRIPTION

Figure 1:
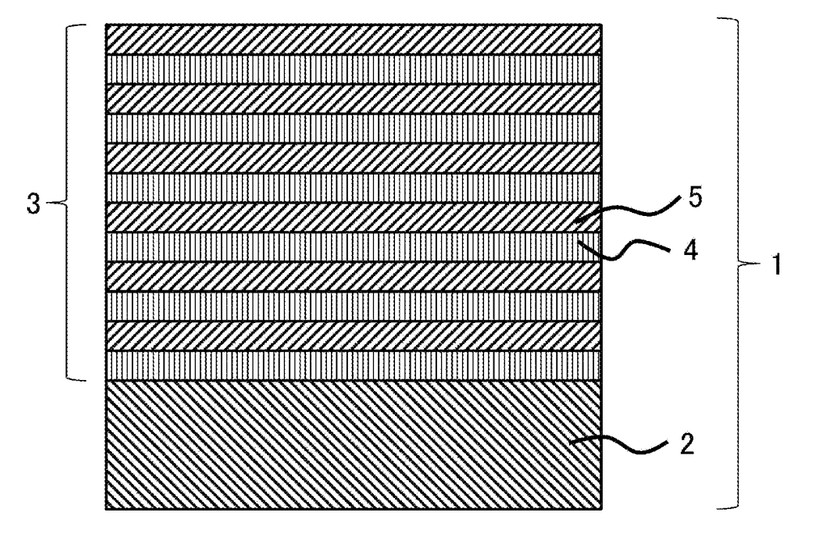
The FIGURE is a schematic illustration of one embodiment of a coated cutting tool according to the present invention.

Although a mode for carrying out the present invention (hereinafter, simply referred to as "the present embodiment") is now described in detail with reference to the drawing as necessary, the present invention should not be limited thereto. Various modifications of the present embodiment may be made within the scope without departing form the gist of the present invention. Corresponding components are designated by corresponding reference numerals in the drawing, and duplicated descriptions are omitted. A positional relationship, such as up, down, right, and left, is based on a positional relationship illustrated in the drawing unless otherwise indicated. Furthermore, a dimension ratio in the drawing is not limited to the illustrated ratio.

Coated Cutting Tool

The FIGURE illustrates a coated cutting tool according to the present embodiment. The coated cutting tool 1 according to the present embodiment includes a substrate 2 and a coating layer 3 formed on a surface of the substrate 2, and has a rake face and a flank. The coating layer 3 has an alternating laminate structure in which first compound layers 4 containing AlN and second compound layers 5 containing a compound are laminated in an alternating manner, the compound having a composition represented by formula (1) below:

$$(Ti_{1-x}Al_x)N \qquad (1)$$

(wherein x denotes an atomic ratio of Al element to a total of Ti element and Al element and satisfies 0.40≤x≤0.70), where average thickness $T_1$ per first compound layer 4 is 5 nm or more to 160 nm or less, and average thickness $T_2$ per second compound layer 5 is 8 nm or more to 200 nm or less, a ratio ($T_1/T_2$) of the average thickness $T_1$ to the average thickness $T_2$ is 0.10 or more to 0.80 or less, the average thickness $T_3$ of the alternating laminate structure is 2.5 µm to 7.0 µm, and a ratio (H/E) of hardness H to elastic modulus E is 0.065 or more to 0.085 or less at the rake face or the flank.

The coated cutting tool 1 according to the present embodiment has the above-described configuration and is thus improved in wear resistance and fracture resistance and has a long tool life as described in detail below.

Substrate

The coated cutting tool 1 according to the present embodiment includes the substrate 2 and the coating layer 3 formed on a surface of the substrate 2. The substrate is not particularly limited as long as it may be used as a substrate for a coated cutting tool. Examples of such a substrate include a cemented carbide, cermet, ceramics, a cubic boron nitride sintered body, a sintered compact of diamond, and high-speed steel. Of these, the substrate is preferably at least one selected from the group consisting of a cemented carbide, cermet, ceramics, and a cubic boron nitride sintered body. In such an aspect, the fracture resistance of the coated cutting tool is likely to be further improved.

Coating Layer

The coating layer 3 has the alternating laminate structure in which the first compound layers 4 containing AlN and the second compound layers 5 containing the compound are laminated in an alternating manner, the compound having the composition represented by formula (1) below:

$$(Ti_{1-x}Al_x)N \qquad (1)$$

(wherein x denotes an atomic ratio of Al element to a total of Ti element and Al element and satisfies 0.40≤x≤0.70).

First Compound Layer

The first compound layer 4 contains AlN. Since AlN has a high thermal conductivity, the inclusion of AlN in the first compound layer 4 allows the heat generated on the surface of the coating layer to be more easily transferred to the inside of the coating layer, preventing the heat from being accumulated in the vicinity of a cutting blade. As a result, the coated cutting tool 1 has improved heat resistance and welding resistance, and thus exhibits high wear resistance and high fracture resistance even in milling, which tends to increase the temperature of the cutting tool.

The content of AlN in the first compound layer 4 is preferably more than 50 mass %, more preferably 70 mass % or more, and further preferably 90 mass % or more to the whole amount of the first compound layer, but is not limited thereto. The content of AlN within the above-described range allows heat conduction due to AlN to be further exhibited, leading to further improvement in wear resistance and fracture resistance of the coated cutting tool 1. From the same perspective, the first compound layer 4 is particularly preferably made of AlN. However, "the first compound layer made of AlN" is not intended to exclude that the first compound layer contains inevitable impurities. In other words, even if the first compound layer contains inevitable impurities, the first compound layer can be said to be made of AlN in the case where the other component is AlN.

In this specification, "inevitable impurities" refer to components contained in the amount of 1.0 mass % or less in the compound layer. The content of inevitable impurities in the first compound layer 4 is preferably 1000 ppm or less, more preferably 100 ppm or less, and further preferably 10 ppm or less to the whole amount of the first compound layer.

The average thickness $T_1$ per first compound layer 4 is 5 nm or more to 160 nm or less. The average thickness $T_1$ of 5 nm or more allows the effect of the first compound layer to be effectively and reliably exhibited. Average thickness $T_1$ of more than 160 nm increases a proportion of the first compound layer having inadequate wear resistance alone in the coating layer, and thus tends to cause thermal cracking. The coated cutting tool 1 does not cause such a problem because of having an average thickness $T_1$ per first compound layer 4 of 160 nm or less. Specifically, the coated cutting tool 1 has high wear resistance and high fracture resistance because of its average thickness $T_1$ of 160 nm or less. Based on the same viewpoint, the average thickness $T_1$ is preferably 6 nm or more to 150 nm or less, and more preferably 8 nm or more to 100 nm or less.

Second Compound Layer

The second compound layer 5 contains the compound having the composition represented by formula (1) below:

$$(Ti_{1-x}Al_x)N \qquad (1)$$

(wherein x denotes the atomic ratio of Al element to a total of Ti element and Al element and satisfies 0.40≤x≤0.70). In this specification, when a composition of a compound is expressed as $(Ti_{1-x}Al_x)N$, x denotes the atomic ratio of Al element to the total of Ti element and Al element, and 1-x denotes the atomic ratio of Ti element to the total of Ti element and Al element.

Nitrides of Ti and Al elements (hereinafter referred to as (Ti, Al)N) typically contain cubic crystals. The cubic crystals are known to be phase-transformed into hexagonal crystals by heat, resulting in an increase in the volume of the crystals. In general, in machining that induces a rapid temperature rise in a cutting edge, such as in milling, fractures in a cutting tool tend to occur due to thermal cracks caused by the rapid temperature rise. When the coated cutting tool 1 is highly heated by cutting or the like, since the cubic crystals of (Ti, Al)N contained in the second compound layer 5 are phase-transformed into the hexagonal crystals during the cutting, the volume of the crystals of (Ti, Al)N in the second compound layer 5 probably expands during the cutting. Such expansion of the crystals causes compressive stress within the coated cutting tool 1. Hence, even if fine thermal cracks occur due to the abrupt temperature increase caused by cutting, the compressive stress inhibits the fine thermal cracks from propagating into the coating layer and growing to the extent that they will cause fractures in the coated cutting tool. For this reason, the coated cutting tool 1 will have high wear resistance and high fracture resistance (particularly wear resistance and fracture resistance in milling), although such a reason is not limitative.

When (Ti, Al)N in the second compound layer 5 has the composition represented by formula (1), the coated cutting tool 1 is presumably improved in wear resistance and fracture resistance for the following reason. That is, x of 0.40 or more to 0.70 or less in formula (1) presumably allows the effect of compressive-stress generation to be effectively and reliably exhibited, resulting in improvement in wear resistance and fracture resistance of the coated cutting tool 1. This is because x of 0.40 or more in formula (1) facilitates effective solid-solution strengthening, resulting in an increase in hardness of the coating layer, and x of 0.70 or less in formula (1) relatively decreases the amount of the hexagonal (Ti, Al)N while relatively increasing the amount of cubic (Ti, Al)N, although such reasons are not limitative.

The value of x in formula (1) is preferably 0.50 or more and more preferably 0.55 or more in order to further improve the wear resistance and the fracture resistance of the coated cutting tool 1. In such an aspect, a proportion of Al in (Ti, Al)N is relatively large, leading to a large rate of cubic expansion in crystal expansion due to the crystal phase transformation, and thus the effect of compressive-stress generation tends to be exhibited further effectively and reliably. The relative increase in proportion of Al in (Ti, Al)N is also preferable in order to increase heat conductivity of the second compound layer.

The composition of (Ti, Al)N in the second compound layer 5 can be measured by a known method. Such a method includes X-ray photoelectron spectroscopy (XPS), X-ray diffractometry (XRD), wavelength-dispersive X-ray analyzer (WDS), and energy-dispersive X-ray analysis (EDS). More specifically, the composition can be measured by a method described in Example.

The content of the compound having the composition represented by formula (1) in the second compound layer 5 is preferably more than 50 mass %, more preferably 70 mass % or more, and further preferably 90 mass % or more to the whole amount of the second compound layer, but is not limited thereto. The content of the compound having the composition represented by formula (1) falls within the above-described range, allowing the effect of compressive-stress generation to be exhibited further effectively and reliably and further improving the wear resistance and the fracture resistance of the coated cutting tool 1. Based on the same viewpoint, the second compound layer 5 is most preferably made of the compound having the composition represented by formula (1). However, "the second compound layer is made of the compound having the composition represented by formula (1)" does not exclude that the second compound layer contains inevitable impurities. In other words, even if the second compound layer contains inevitable impurities, the second compound layer can be said to be made of the compound having the composition represented by formula (1) in the case where the other component is the compound having the composition represented by formula (1). The content of inevitable impurities in the second compound layer 5 is preferably 1000 ppm or less, more preferably 100 ppm or less, and further preferably 10 ppm or less to the whole amount of the second compound layer.

The second compound layer 5 preferably contains the cubic crystals of (Ti, Al)N, and has a Full Width at Half Maximum (FWHM) of 0.5° or more to 2.0° or less of a diffraction peak of a plane (200) of the cubic crystals measured by X-ray diffraction measurement. In such an aspect, since the full width at half maximum is 0.5° or more, the amount of coarse crystal grains is small, and thus toughness of the second compound layer is further improved. In addition, since the full width at half maximum is 2.0° or less, a proportion of fine crystal grains is small, and thus wear resistance of the second compound layer is further improved. The second compound layer thus has toughness and wear resistance in good balance. As a result, the coated cutting tool 1 has higher wear resistance and higher fracture resistance. From the viewpoint of making crystal grains of the cubic crystals of (Ti, Al)N within a more appropriate range, the above-described full width at half maximum is more preferably 0.8° or more to 1.8° or less. Although (Ti, Al)N in the term "cubic crystals of (Ti, Al)N" refers to not only the compound having the composition represented by formula (1) but also any composite nitride containing Ti and Al, the "cubic crystals of (Ti, Al)N" are preferably cubic crystals of the compound having the composition represented by formula (1) in order to exhibit the above-described effect effectively and reliably.

The full width at half maximum of the diffraction peak of the plane (200) of the cubic crystals of (Ti, Al)N in the second compound layer can be measured by using a commercially available X-ray diffractometer. For example, X-ray diffractometer "RINT TTRIII" from Rigaku Corporation is used for X-ray diffraction measurement with a 2θ/θ concentration optical system using Cu-Kα radiation. An exemplary measurement condition is as follows: Characteristic X-rays: Cu-Kα, monochromator: Ni, divergence slit: (½)°, scattering slit: (⅔)°, reception slit: 0.15 mm, and sampling width: 0.01°. The full width at half maximum of the diffraction peak may be determined from a resultant X-ray diffraction pattern using analysis software attached to the X-ray diffractometer. The analysis software can be used to perform background processing and Kα2 peak removal using cubic expression approximation and determine full width at half maximum of a diffraction peak through profile fitting using the Pearson VII function. The full width at half maximum of the diffraction peak may be measured by a thin film X-ray diffraction technique. Such a measurement method reliably prevents results of the X-ray diffraction measurement from being affected by a layer other than the second compound layer. When the second compound layer is not exposed on the surface of the coated cutting tool, any other exposed layers may be removed by buffing or the like and then the X-ray diffraction measurement may be conducted.

The full width at half maximum of the diffraction peak of the plane (200) of the cubic crystals of (Ti, Al)N in the second compound layer tends to decrease as the average thickness per second compound layer 5 decreases. Use of a compound having a larger value of x in formula (1) tends to increase the full width at half maximum.

The average thickness $T_2$ per second compound layer 5 is 8 nm or more to 200 nm or less. The average thickness $T_2$ of 8 nm or more allows the effect of the second compound layer to be effectively and reliably exhibited. Average thickness $T_2$ of more than 200 nm increases a proportion of the second compound layer, which has inadequate heat conductivity alone, in the coating layer, and thus tends to cause thermal cracking. However, the coated cutting tool 1 does not cause such a problem because the average thickness $T_2$ per second compound layer 5 is 200 nm or less. In other words, the coated cutting tool 1 has high wear resistance and high fracture resistance because of the average thickness $T_2$ of 200 nm or less. The average thickness $T_2$ is preferably 10 nm or more to 160 nm or less, more preferably 15 nm or more to 120 nm or less.

Alternating Laminate Structure

The coating layer 3 has the alternating laminate structure in which the first compound layers 4 and the second compound layers 5 are laminated in an alternating manner, where the ratio ($T_1/T_2$) of the average thickness $T_1$ to the average thickness $T_2$ is 0.10 or more to 0.80 or less. As described above, the first compound layer containing AlN has high heat conductivity and prevents accumulation of heat generated in the coating layer due to cutting, and thus suppresses thermal cracking. The second compound layer containing the compound having the composition represented by formula (1) generates compressive stress due to heat generated during cutting, and thus suppresses propagation of a thermal crack into the coating layer. Furthermore, the second compound layer containing the compound having the composition represented by formula (1) has a sufficiently high hardness through solid-solution strengthening. However, the inventor has found that when a coated cutting tool includes only the first compound layer or only the second compound layer, at least one of the wear resistance and the fracture resistance is insufficient, and has further found that when a coated cutting tool has the alternating laminate structure in which the first compound layers and the second compound layers are laminated in an alternating manner at a specific ratio as described above, the wear resistance and the fracture resistance are excellent.

Specifically, the inventor has found that when the ratio ($T_1/T_2$) of the average thickness $T_1$ to the average thickness $T_2$ is 0.10 or more to 0.80 or less in the alternating laminate structure in which the first compound layers 4 and the second compound layers 5 are laminated in an alternating manner, the effect of the first compound layer and the effect of the second compound layer are synergistically exhibited, leading to significant improvement in wear resistance and fracture resistance of the coated cutting tool 1. The inventor has considered the reason for this as follows, although such a reason is not limitative. The first compound layer containing AlN does not have high wear resistance and high toughness while having high heat conductivity. On the other hand, the second compound layer containing the compound having the composition represented by formula (1) has higher wear resistance and higher toughness than the first compound layer. The alternating laminate structure therefore may have a good balance between wear resistance and thermal shock resistance by increasing the average thickness per the second compound layer relative to average thickness per the first compound layer within a predetermined range. As a result, the ratio ($T_1/T_2$) of 0.10 or more to 0.80 or less would improve the wear resistance and the fracture resistance of the coated cutting tool 1.

The ratio ($T_1/T_2$) is preferably 0.20 or more to 0.70 or less, more preferably 0.30 or more to 0.68 or less, and further preferably 0.40 or more to 0.65 or less in order to achieve better balance between the wear resistance and the thermal shock resistance.

Furthermore, the average thickness $T_3$ of the alternating laminate structure is 2.5 μm or more to 7.0 μm or less in order to exhibit the effect of the alternating laminate structure effectively and reliably. In particular, the average thickness $T_3$ of 2.5 μm or more improves the wear resistance of the coated cutting tool 1. The average thickness $T_3$ of 7.0 μm or less suppresses the occurrence of fractures in the coated cutting tool 1 caused by peeling of the coating layer including the alternating laminate structure. Based on the same viewpoint, the average thickness $T_3$ is preferably 2.5 μm or more to 7.0 μm or less, more preferably 3.0 μm or more to 6.0 μm or less, and further preferably 3.5 μm or more to 5.0 μm or less.

The coating layer 3 may allow any number of repetitions of stacking of the first compound layer 4 and the second compound layer 5 as long as the average thicknesses $T_1$, $T_2$, and $T_3$ fall within the above-described range. Specifically, the number of repetitions may be 5 or more to 600 or less, 10 or more to 500 or less, 20 or more to 400 or less, or 30 or more to 300 or less. In this specification, when the alternating laminate structure has one first compound layer 4 and one second compound layer 5, the above-described "number of repetitions" is one.

Upper Layer

In the coated cutting tool 1 illustrated in the FIGURE, while the coating layer 3 includes the alternating laminate structure in which the first compound layers 4 and the second compound layers 5 are laminated in an alternating manner, the coating layer 3 may have an upper layer on a surface of the alternating laminate structure on a side opposite to the substrate 2. In such an aspect, the wear resistance of the coated cutting tool 1 is likely to be further improved. Such an upper layer includes a single or multiple compound layers of: at least one element selected from the group consisting of Ti, Zr, Hf, V, Nb, Ta, Cr, Mo, W, Al, Si, and Y; and at least one element selected from the group consisting of C, N, O, and B. For the upper layer, "stacking of the compound including at least one element selected from the group consisting of Ti, Zr, Hf, V, Nb, Ta, Cr, Mo, W, Al, Si, and Y and at least one element selected from the group consisting of C, N, O, and B" refers to stacking of two or more layers each including the compound satisfying the above-described condition while each two adjacent layers have compositions different from each other.

For the coating layer 3 having the upper layer, the average thickness of the upper layer is preferably 0.1 μm or more to 3.0 μm or less in order to exhibit the effect of improvement in wear resistance effectively and reliably. Based on the same viewpoint, the average thickness of the upper layer is more preferably 0.2 μm or more to 2.5 μm or less, and further preferably 0.3 μm or more to 2.0 μm or less.

For the coating layer 3 having no upper layer, the average thickness of the coating layer 3 is equal to the average thickness of the alternating laminate structure. For the coating layer 3 having the upper layer, the average thickness $T_4$ of the coating layer 3 is expressed by the sum of the average thickness $T_3$ of the alternating laminate structure and the average thickness of the upper layer. The average thickness $T_4$ of the coating layer 3 is preferably 2.5 µm or more to 9.0 µm or less, more preferably 3.0 µm or more to 8.5 µm or less, and further preferably 3.5 µm or more to 7.0 µm or less. The average thickness $T_4$ of 2.5 µm or more tends to further improve the wear resistance of the coated cutting tool 1. The average thickness $T_4$ of 9.0 µm or less suppresses the occurrence of fractures in the coated cutting tool 1 caused by peeling of the coating layer.

The ratio of the average thickness $T_3$ of the alternating laminate structure to the average thickness $T_4$ of the coating layer 3 is preferably 0.7 or more to 1.0 or less. In such an aspect, 70% or more of the coating layer is the alternating laminate structure, so that the effects of the present embodiment tend to be effectively and reliably exhibited. Based on the same viewpoint, the ratio $(T_3/T_4)$ is more preferably 0.8 or more to 1.0 or less.

Elastic Modulus and Hardness

The coated cutting tool 1 according to the present embodiment as illustrated in the FIGURE has the rake face and the flank, where the ratio (H/E) of hardness H to elastic modulus E is 0.065 or more to 0.085 or less at the rake face or the flank. The ratio (H/E) corresponds to the measured amount indicating a ratio between the cubic crystals and the hexagonal crystals in both AlN in the first compound layer and (Ti, Al)N in the second compound layer. A relatively high ratio (H/E) tends to provide a relatively high proportion of the hexagonal crystals in both AlN and (Ti, Al)N and thus tends to provide high toughness of the coated cutting tool. A relatively low ratio (H/E) tends to provide a relatively high proportion of the cubic crystals in both AlN and (Ti, Al)N and thus tends to allow the effect of generation of compressive stress to be effectively and reliably exhibited.

The coated cutting tool 1, having the ratio (H/E) of 0.065 or more, has high fracture resistance because AlN and (Ti, Al)N are each likely to contain the cubic crystals at a predetermined rate. Furthermore, the coated cutting tool 1, having the ratio (H/E) of 0.085 or less, has high wear resistance because AlN and (Ti, Al)N are each likely to contain the hexagonal crystals at a predetermined rate. Specifically, in such an aspect, the ratio between the cubic crystals and the hexagonal crystals is well-balanced in both AlN and (Ti, Al)N, and thus the coated cutting tool 1 has high wear resistance and high fracture resistance.

Based on the same viewpoint, the ratio (H/E) is preferably 0.067 or more to 0.083 or less and more preferably 0.069 or more to 0.080 or less.

The elastic modulus E and the hardness H are each a physical property value in a unit of Pa (in detail, GPa), and can be measured by pressing a dynamic hardness tester to a portion to be measured (hereinafter, such measurement is referred to as "nano-indentation measurement"). In this specification, the nano-indentation measurement is performed in accordance with the standard defined by the International Standards Organization (ISO 14577). Any dynamic hardness tester that conforms to the standard, for example, "Nano Indenter" from MTS Systems Corporation, can be used without limitation. A more specific measurement method of the elastic modulus E and the hardness H includes a method according to ISO 14577 as described in Example.

The coated cutting tool 1 thus has the ratio (H/E) of 0.065 or more to 0.085 or less at the rake face or the flank. This means that the mean (arithmetic mean) of the ratios (H/E) of 0.065 or more to 0.085 or less is obtained through nano-indentation measurement at ten or more portions at the rake face or the flank of the coated cutting tool 1. When the coating layer is formed by a physical vapor deposition (PVD) process, particles called droplets may adhere on the rake face and/or the flank. In such a case, the nano-indentation measurement is performed so as to avoid the droplets. The ratio (H/E) of the coated cutting tool 1 is preferably measured at the rake face in order to further improve the wear resistance and the fracture resistance. The clause "the ratio (H/E) of the coated cutting tool 1 is measured at the rake face" refers to using, as the ratio (H/E), the mean (arithmetic mean) of the ratios (H/E) obtained through nano-indentation measurement at ten or more portions at the rake face of the coated cutting tool 1.

The coated cutting tool 1 preferably has hardness $H_2$ at the flank higher than hardness $H_1$ at the rake face. When hardness of the flank is thus higher than hardness of the rake face, abrasion of the flank is further suppressed during cutting, and consequently the coated cutting tool 1 as a whole is likely to be further improved in wear resistance. In case of the ratio (H/E) of 0.065 or more to 0.085 or less at the rake face, when the hardness $H_2$ at the flank is higher than the hardness $H_1$ at the rake face, the ratio (H/E) measured at the flank also tends to be about 0.065 or more to 0.085 or less, and thus the coated cutting tool is likely to be further improved in the wear resistance and the fracture resistance.

The coated cutting tool 1 preferably has a difference $(H_2-H_1)$ of 0.5 GPa or more to 1.5 GPa or less between the hardness $H_2$ at the flank and the hardness $H_1$ at the rake face. In such an aspect, abrasion of the flank is further suppressed, so that the coated cutting tool 1 as a whole is likely to be further improved in wear resistance. Specifically, the difference $(H_2-H_1)$ of 0.5 GPa or more can further improve wear resistance at the flank, and the difference $(H_2-H_1)$ of 1.5 GPa or less provides a better balance between toughness and wear resistance at the flank.

Although the coated cutting tool 1 may not have a specific hardness $H_2$ at the flank and a specific hardness $H_1$ at the rake face, the hardness $H_1$ is preferably 28.0 GPa or more to 35.0 GPa or less and more preferably 29.0 GPa or more to 34.0 GPa or less in order to further improve the wear resistance and the fracture resistance. Similarly, the hardness $H_2$ is preferably 28.5 GPa or more to 36.0 GPa or less and more preferably 29.5 GPa or more to 35.0 GPa or less.

The hardness H and the elastic modulus E at each of the faces, the rake face and the flank, of the coated cutting tool 1 can be controlled by appropriately adjusting a production condition of the coating layer in a manufacturing method of the coated cutting tool as described in detail below, although such a control method is not limitative. Besides this, when x in formula (1) is increased in the compound having the composition represented by formula (1) in the second compound layer 5, the difference $(H_2-H_1)$ tends to increase: hence, the difference $(H_2-H_1)$ may be controlled by adjusting x in formula (1).

Manufacturing Method of Coating Layer

The coating layer 3 of the coated cutting tool 1 illustrated in the FIGURE can be manufactured by various methods, for example, a physical vapor deposition process, such as an ion plating process, an arc ion plating process, a sputtering process, and an ion mixing process. The coating layer is preferably formed by the physical vapor deposition process because a sharp edge is formed on the coated cutting tool thereby. In particular, the arc ion plating process is more preferable because it enables manufacturing of a coated cutting tool with better adhesion between the coating layer 3 and the substrate 2.

Manufacturing Method of Coated Cutting Tool

A method of manufacturing the coated cutting tool 1 illustrated in the FIGURE is now specifically described. The method is not limited as long as the method may achieve the configuration of the coated cutting tool according to the present embodiment.

First, a substrate 2 formed into a tool shape is prepared. The substrate 2 may be manufactured by a known method or may be commercially obtained. The substrate and metal evaporation sources are placed in a reactor of a physical vapor deposition apparatus, and the reactor is evacuated up to its internal pressure of $1 \times 10^{-2}$ Pa or lower. Subsequently, the substrate is heated by a heater in the reactor to a substrate temperature of 200° C. or more to 800° C. or less. Subsequently, Ar gas is introduced into the reactor to adjust the internal pressure of the reactor to 0.5 Pa or more to 5.0 Pa or less. Under the Ar gas atmosphere at a pressure of 0.5 Pa or more to 5.0 Pa or less, a current of 5 A or more to 60 A or less is supplied to a tungsten filament in the reactor while a bias voltage of −1000 V or more to −200 V or less is applied to the substrate, so that Ar ion bombardment is performed on a surface of the substrate. After that, the reactor is evacuated up to its internal pressure of $1 \times 10^{-2}$ Pa or lower.

Subsequently, two metal evaporation sources are alternately evaporated through arc discharge under a predetermined condition to form the alternating laminate structure in which the first compound layers 4 and the second compound layers 5 are laminated in an alternating manner, on the surface of the substrate 2 (arc ion plating process). Average thickness per first compound layer and average thickness per second compound layer can each be controlled by adjusting arc discharge time of the relevant metal evaporation source.

The first compound layer is formed by arc discharge under the following condition, for example. While the substrate temperature is maintained at 300° C. or more to 500° C. or less by the heater in the reactor, a mixed gas of nitrogen gas ($N_2$) and argon gas (Ar) is introduced into the reactor so as to adjust the internal pressure of the reactor to 0.5 Pa or more to 5.0 Pa or less. Subsequently, while a bias voltage of −100 V or more to −40 V or less is applied to the substrate, metal evaporation sources corresponding to metal components of the first compound layer are evaporated by arc discharge of 60 A or more to 120 A or less to form the first compound layer. A proportion of nitrogen gas ($N_2/(Ar+N_2)$) may be 0.2 or more to 0.8 or less by volume ratio in the mixed gas of nitrogen gas ($N_2$) and argon gas (Ar).

The second compound layer is formed by arc discharge under the following condition, for example. While the substrate temperature is maintained at 300° C. or more to 500° C. or less by the heater in the reactor, a mixed gas of nitrogen gas ($N_2$) and argon gas (Ar) is introduced into the reactor so as to adjust the internal pressure of the reactor to 0.5 Pa or more to 5.0 Pa or less. Subsequently, while a bias voltage of −120 V or more to −40 V or less is applied to the substrate, metal evaporation sources corresponding to metal components of the second compound layer are evaporated by arc discharge of 100 A or more to 150 A or less to form the second compound layer. The proportion of nitrogen gas ($N_2/(Ar+N_2)$) may be 0.2 or more to 0.8 or less by volume ratio in the mixed gas of nitrogen gas ($N_2$) and argon gas (Ar). For the compound having the composition represented by formula (1) in the second compound layer, x in formula (1) can be controlled by varying the composition of the metal evaporation sources.

The hardness H and the elastic modulus E of the coated cutting tool 1 can each be controlled by appropriately adjusting respective formation conditions of the first compound layer and the second compound layer. For example, the hardness H and the elastic modulus E of the coated cutting tool 1 each tends to be increased by increasing a negative bias voltage to be applied to the substrate, i.e., increasing an absolute value of the bias voltage during formation of the first compound layer and/or the second compound layer. In addition, since the hardness H tends to have a larger bias voltage dependence than the elastic modulus E, the ratio (H/E) of the hardness H to the elastic modulus E can be controlled by appropriately adjusting the bias voltage.

A difference in hardness between the flank and the rake face tends to be increased by increasing pressure of the mixed gas of nitrogen gas and argon gas during formation of the first compound layer and/or the second compound layer. Furthermore, the difference in hardness between the flank and the rake face tends to be increased by decreasing the proportion of nitrogen gas ($N_2/(Ar+N_2)$) by volume ratio in the mixed gas of nitrogen gas ($N_2$) and argon gas (Ar). Thus, while the hardness at the flank is adjusted to be higher than the hardness at the rake face, the first compound layer and the second compound layer are each formed under the above-described condition, making it possible to control the difference ($H_2-H_1$) between the hardness $H_2$ and the hardness $H_1$.

The pressure of the mixed gas of nitrogen gas and argon gas is preferably 2.0 Pa or more to 4.0 Pa or less during formation of the first compound layer and the second compound layer in order to obtain more preferable values of various physical properties of the coated cutting tool 1. For the same purpose, the proportion of nitrogen gas ($N_2/(Ar+N_2)$) by volume ratio in the mixed gas is preferably 0.3 or more to 0.7 or less during formation of the first compound layer and the second compound layer. For the same purpose, a bias voltage of −90 V or more to −50 V or less is preferably applied to the substrate during formation of the first compound layer. Similarly, a bias voltage of −140 V or more to −110 V or less is preferably applied to the substrate during formation of the second compound layer.

When the coating layer 3 has the upper layer on the side opposite to the substrate of the alternating laminate structure, the upper layer is formed through additional arc discharge under the following condition after forming the alternating laminate structure. Specifically, while the substrate temperature is maintained at 400° C. or more to 600° C. or less by the heater in the reactor, a predetermined reaction gas is introduced into the reactor so as to adjust the internal pressure of the reactor to 0.5 Pa or more to 5.0 Pa or less. Subsequently, while a bias voltage of −80 V or more to −40 V or less is applied to the substrate, metal evaporation sources corresponding to metal components of the upper layer are evaporated by arc discharge of 100 A or more to 200 A or less to form the upper layer. For example, when the upper layer is composed of a compound including at least one element selected from the group consisting of Ti, Zr, Hf, V, Nb, Ta, Cr, Mo, W, Al, Si, and Y and including N, $N_2$ gas is used as the reaction gas. When the upper layer is composed of a compound including at least one element selected from the group consisting of Ti, Zr, Hf, V, Nb, Ta, Cr, Mo, W, Al, Si, and Y and including N and C, a mixed gas of $N_2$ gas and $C_2H_2$ gas is used as the reaction gas. A volume ratio of such a mixed gas is not limited, but may be $N_2$ gas: $C_2H_2$ gas=95:5 to 85:15, for example.

Thickness of each layer configuring the coating layer 3 can be measured from a sectional structure of the coated cutting tool 1 using a microscope, such as an optical microscope, a scanning electron microscope (SEM), and a transmission electron microscope (TEM). The average thickness of each layer configuring the coating layer 3 can be obtained by: measuring the thickness of each layer from sections at three or more portions near a position 50 μm away from a cross line part (also referred to as edge line part) between the flank and the rake face of a surface toward the center of the surface, the surface being a surface of the coating layer 3 facing the metal evaporation sources; and calculating the mean (arithmetic mean) of the measured thicknesses.

The composition of each layer configuring the coating layer 3 can be measured from a sectional structure of the coated cutting tool 1 using X-ray photoelectron spectroscopy (XPS), X-ray diffractometry (XRD), a wavelength-dispersive X-ray spectroscope (WDS), energy-dispersive X-ray spectroscopy (EDS), or others.

The coated cutting tool according to the present embodiment is regarded as having a longer tool life than in the related art at least because of its high wear resistance and high fracture resistance, although such a reason is not limitative. Specific examples of types of the coated cutting tool according to the present embodiment include an indexable cutting insert for milling or turning, a drill, and an end mil.

EXAMPLE

Although the present invention is described further in detail below with Example, the present invention is not limited thereto.

A cemented carbide insert (SWMT13T3AFPR-MJ from Tungaloy Corporation) having a composition of 89.6% WC-9.8% Co-0.6% $Cr_3C_2$ (by mass %) was prepared as a substrate. Metal evaporation sources were placed in a reactor of an arc ion plating apparatus so as to provide the composition of each layer listed in Table 2. The substrate was fixed to a fixation fitting of a rotating table in the reactor.

Subsequently, the reactor was hermetically sealed and evacuated up to its internal pressure of $5.0 \times 10^{-3}$ Pa or lower. Subsequently, the substrate was heated by a heater in the reactor up to its temperature of 450° C. Subsequently, Ar gas was introduced into the reactor so as to increase the internal pressure up to 2.7 Pa.

Under the Ar gas atmosphere at a pressure of 2.7 Pa, a current of 40 A was supplied to a tungsten filament in the reactor while a bias voltage of −400 V was applied to the substrate, so that Ar ion bombardment was performed for 30 minutes on a surface of the substrate. After the ion bombardment was finished, the reactor was evacuated up to its internal pressure of $5.0 \times 10^{-3}$ Pa or lower.

Invention samples 1 to 15 and comparative samples 1 to 10 were each produced as follows. After the evacuation, while output of the heater in the reactor was controlled such that the substrate temperature was maintained at the relevant film forming temperature listed in Table 1, a mixed gas of nitrogen gas ($N_2$) and argon gas (Ar), having the relevant nitrogen gas proportion ($N_2/(Ar+N_2)$) by volume ratio listed in Table 1, was introduced into the reactor, and flowrate of each gas was controlled to adjust the internal pressure of the reactor to the relevant pressure listed in Table 1.

After that, while the substrate temperature (film forming temperature), the nitrogen gas proportion in the mixed gas, and the internal pressure of the reactor were maintained at respective conditions listed in Table 1, the first compound layer and the second compound layer, each including a compound having the relevant composition listed in Table 2, were alternately and repeatedly formed in this order by an arc ion plating process. In the arc ion plating process, arc discharge was performed by supplying the relevant current listed in Table 1 to the relevant metal evaporation source while applying the relevant bias voltage listed in Table 1 to the substrate. Discharge time of the arc discharge was controlled such that the first compound layer and the second compound layer each had the average thicknesses listed in Table 2, and the arc discharge was repeated such that the number of stacks (number of repetitions of stacking) of the first compound layer and the second compound layer had the relevant value listed in Table 2. A blank in each of Tables 1 and 2 refers to the fact that no relevant layer was formed, for example, no second compound layer was formed in comparative sample 1, or no first compound layer was formed in comparative sample 2. In other words, comparative sample 1 had a coating layer including only the first compound layer, and comparative sample 2 had a coating layer including only the second compound layer.

In this way, each coating layer was formed on the surface of the substrate so as to have a predetermined, alternating laminate structure listed in Table 2, and then the heater was turned off. When the temperature of each of samples (invention samples 1 to 15 and comparative samples 1 to 10) dropped to 100° C. or lower, the sample was taken out of the reactor.

TABLE 1

| Sample No. | Film formation temperature (° C.) | Gas condition Pressure (Pa) | Gas condition $N_2/(N_2 + Ar)$ | Discharge condition (first compound layer) Voltage (V) | Discharge condition (first compound layer) Current (A) | Discharge condition (second compound layer) Voltage (V) | Discharge condition (second compound layer) Current (A) |
| --- | --- | --- | --- | --- | --- | --- | --- |
| Invention Sample 1 | 400 | 3.0 | 0.5 | −80 | 80 | −80 | 120 |
| Invention Sample 2 | 400 | 3.0 | 0.3 | −80 | 80 | −80 | 120 |
| Invention Sample 3 | 400 | 3.0 | 0.7 | −60 | 90 | −80 | 120 |
| Invention Sample 4 | 400 | 3.0 | 0.4 | −60 | 100 | −120 | 120 |
| Invention Sample 5 | 400 | 2.5 | 0.7 | −80 | 80 | −80 | 120 |
| Invention Sample 6 | 400 | 3.0 | 0.4 | −60 | 80 | −60 | 120 |
| Invention Sample 7 | 400 | 3.0 | 0.4 | −80 | 80 | −80 | 120 |
| Invention Sample 8 | 400 | 3.0 | 0.5 | −80 | 80 | −80 | 120 |
| Invention Sample 9 | 300 | 3.0 | 0.5 | −80 | 80 | −80 | 120 |

TABLE 1-continued

| Sample No. | Film formation temperature (° C.) | Gas condition Pressure (Pa) | Gas condition $N_2/(N_2 + Ar)$ | Discharge condition (first compound layer) Voltage (V) | Discharge condition (first compound layer) Current (A) | Discharge condition (second compound layer) Voltage (V) | Discharge condition (second compound layer) Current (A) |
|---|---|---|---|---|---|---|---|
| Invention Sample 10 | 400 | 3.0 | 0.5 | −80 | 80 | −80 | 100 |
| Invention Sample 11 | 400 | 3.0 | 0.5 | −80 | 80 | −80 | 150 |
| Invention Sample 12 | 400 | 3.5 | 0.5 | −100 | 90 | −100 | 120 |
| Invention Sample 13 | 400 | 3.0 | 0.5 | −60 | 80 | −60 | 120 |
| Invention Sample 14 | 400 | 3.0 | 0.5 | −100 | 120 | −100 | 120 |
| Invention Sample 15 | 500 | 3.0 | 0.5 | −70 | 60 | −70 | 120 |
| Comparative Sample 1 | 400 | 3.0 | 1.0 | −60 | 80 | — | — |
| Comparative Sample 2 | 400 | 3.0 | 0.7 | — | — | −80 | 120 |
| Comparative Sample 3 | 400 | 3.0 | 0.4 | −60 | 80 | −80 | 120 |
| Comparative Sample 4 | 400 | 3.0 | 0.7 | −80 | 80 | −80 | 120 |
| Comparative Sample 5 | 400 | 3.0 | 0.3 | −80 | 80 | −80 | 120 |
| Comparative Sample 6 | 400 | 3.0 | 0.5 | −100 | 80 | −100 | 120 |
| Comparative Sample 7 | 400 | 3.0 | 0.5 | −120 | 80 | −120 | 120 |
| Comparative Sample 8 | 400 | 3.0 | 0.5 | −80 | 80 | −80 | 120 |
| Comparative Sample 9 | 400 | 3.0 | 0.5 | −60 | 80 | −60 | 120 |
| Comparative Sample 10 | 400 | 3.0 | 1.0 | −80 | 80 | −80 | 120 |

TABLE 2

| Sample No. | First compound layer Composition | First compound layer Thickness $T_1$ per layer (nm) | Second compound layer Composition (x in $Ti_{1-x}Al_xN$) | Second compound layer Thickness $T_2$ per layer (nm) | Number of repetitions of alternately stacked structure (number of times) | T1/T2 | Average thickness of alternating laminate structure (μm) | Average thickness of entire coating layer (μm) |
|---|---|---|---|---|---|---|---|---|
| Invention Sample 1 | AlN | 5 | 0.6 | 8 | 310 | 0.63 | 4.0 | 4.0 |
| Invention Sample 2 | AlN | 10 | 0.6 | 20 | 135 | 0.50 | 4.1 | 4.1 |
| Invention Sample 3 | AlN | 50 | 0.6 | 100 | 27 | 0.50 | 4.1 | 4.1 |
| Invention Sample 4 | AlN | 160 | 0.6 | 200 | 11 | 0.80 | 4.0 | 4.0 |
| Invention Sample 5 | AlN | 10 | 0.4 | 20 | 135 | 0.50 | 4.1 | 4.1 |
| Invention Sample 6 | AlN | 10 | 0.7 | 20 | 135 | 0.50 | 4.1 | 4.1 |
| Invention Sample 7 | AlN | 10 | 0.6 | 20 | 85 | 0.50 | 2.6 | 2.6 |
| Invention Sample 8 | AlN | 10 | 0.6 | 20 | 230 | 0.50 | 6.9 | 6.9 |
| Invention Sample 9 | AlN | 10 | 0.6 | 90 | 40 | 0.11 | 4.0 | 4.0 |
| Invention Sample 10 | AlN | 10 | 0.6 | 20 | 135 | 0.50 | 4.1 | 4.1 |
| Invention Sample 11 | AlN | 10 | 0.6 | 20 | 135 | 0.50 | 4.1 | 4.1 |
| Invention Sample 12 | AlN | 10 | 0.4 | 20 | 135 | 0.50 | 4.1 | 4.1 |
| Invention Sample 13 | AlN | 10 | 0.7 | 20 | 135 | 0.50 | 4.1 | 4.1 |
| Invention Sample 14 | AlN | 5 | 0.7 | 8 | 310 | 0.63 | 4.0 | 4.0 |
| Invention Sample 15 | AlN | 40 | 0.6 | 80 | 42 | 0.50 | 5.0 | 5.0 |
| Comparative Sample 1 | AlN | 4000 | — | — | — | — | 4.0 | 4.0 |
| Comparative Sample 2 | — | — | 0.6 | 4000 | — | — | 4.0 | 4.0 |
| Comparative Sample 3 | AlN | 200 | 0.6 | 300 | 8 | 0.67 | 4.0 | 4.0 |
| Comparative Sample 4 | AlN | 10 | 0.3 | 20 | 135 | 0.50 | 4.1 | 4.1 |
| Comparative Sample 5 | AlN | 10 | 0.8 | 20 | 135 | 0.50 | 4.1 | 4.1 |
| Comparative Sample 6 | AlN | 10 | 0.6 | 20 | 70 | 0.50 | 2.1 | 2.1 |
| Comparative Sample 7 | AlN | 10 | 0.6 | 20 | 270 | 0.50 | 8.1 | 8.1 |
| Comparative Sample 8 | AlN | 20 | 0.6 | 20 | 100 | 1.00 | 4.0 | 4.0 |
| Comparative Sample 9 | AlN | 50 | 0.6 | 20 | 58 | 2.50 | 4.1 | 4.1 |
| Comparative Sample 10 | AlN | 10 | 0.8 | 20 | 135 | 0.50 | 4.1 | 4.1 |

The average thickness of the individual layer of each resultant sample was measured using a transmission electron microscope (TEM) and confirmed to have the thickness listed in Table 2. More specifically, thickness of each layer was measured through TEM observation of sections at three portions near a position 50 μm away from an edge line part of a surface toward the center of the surface, the surface being a surface of the resultant coated cutting tool on a side opposed to the metal evaporation sources. Subsequently, the mean (arithmetic mean) of the measured thicknesses was calculated to obtain the average thickness. Furthermore, the ratio ($T_1/T_2$) of the average thickness $T_1$ per first compound layer to the average thickness $T_2$ per second compound layer was calculated. Such calculation results are listed in Table 2.

A composition of the individual layer of each resultant sample was measured using a transmission electron microscope (TEM) with an energy-dispersive X-ray spectrometer (EDS) and confirmed to have the composition listed in Table 2. More specifically, the composition of each layer was measured using EDS attached to TEM on a section near a position 50 μm away from an edge line part of a surface toward the center of the surface, the surface being a surface of the resultant coated cutting tool on a side opposed to the metal evaporation sources.

Elastic Modulus and Hardness

The resultant samples were subjected to measurement of hardness $H_1$ and elastic modulus $E_1$ at the rake face and measurement of hardness $H_2$ and elastic modulus $E_2$ at the flank by a nano-indentation method using a dynamic hardness tester ("Nano Indenter" from MTS Systems Corporation). More specifically, nano-indentation measurement was performed at ten points in both the rake face and the flank of each resultant sample so as to avoid droplets, and the mean (arithmetic mean) of the measured values was calculated to obtain the values of the hardness and the elastic modulus. Furthermore, a difference ($H_2-H_1$) between the hardness $H_2$ at the flank and the hardness $H_1$ at the rake face was calculated. Results of such calculations are listed in Table 3. In any of the samples, a ratio ($H_2/E_2$) of the elastic modulus $E_2$ to the hardness $H_2$ at the flank was approximately equal to a ratio ($H_1/E_1$) at the rake face.

Full Width at Half Maximum of Diffraction Peak of Plane (200) of Cubic Crystal

The resultant samples were each subjected to measurement of a full width at half maximum of a diffraction peak of the plane (200) of cubic crystals of (Ti, Al)N using X-ray diffractometer "RINT TTRIII" from Rigaku Corporation. More specifically, each sample was set in the X-ray diffractometer and subjected to X-ray diffraction measurement with a 2θ/θ concentration optical system using Cu-Kα radiation. The measurement condition was as follows: Characteristic X-rays: Cu-Kα radiation, monochromator: Ni, divergence slit: (½)°, scattering slit: (⅔)°, reception slit: 0.15 mm, and sampling width: 0.01°. The full width at half maximum of the diffraction peak was obtained from a resultant X-ray diffraction pattern using analysis software attached to the X-ray diffractometer. The analysis software was used to perform background processing and Kα2 peak removal using cubic expression approximation and determine full width at half maximum of a diffraction peak through profile fitting using the Pearson VII function. However, comparative sample 1 having no second compound layer was not subjected to the measurement of the full width at half maximum. Results of such measurement are listed in the columns of "Full width at half maximum" in Table 3.

TABLE 3

| Sample No. | Full width at half maximum (°) | $H_1$(GPa) | $E_1$(GPa) | $H_1/E_1$ | $H_2$(GPa) | $H_2 - H_1$(GPa) |
|---|---|---|---|---|---|---|
| Invention Sample 1 | 1.8 | 32.2 | 447.2 | 0.072 | 32.9 | 0.7 |
| Invention Sample 2 | 1.3 | 32.3 | 461.4 | 0.070 | 33.1 | 0.8 |
| Invention Sample 3 | 0.9 | 32.1 | 465.2 | 0.069 | 32.9 | 0.8 |
| Invention Sample 4 | 0.5 | 32.3 | 430.7 | 0.075 | 33.2 | 0.9 |
| Invention Sample 5 | 1.2 | 32.0 | 470.6 | 0.068 | 32.0 | 0.0 |
| Invention Sample 6 | 1.4 | 28.8 | 342.9 | 0.084 | 29.7 | 0.9 |
| Invention Sample 7 | 1.2 | 32.2 | 447.2 | 0.072 | 32.9 | 0.7 |
| Invention Sample 8 | 1.3 | 33.0 | 464.8 | 0.071 | 33.8 | 0.8 |
| Invention Sample 9 | 0.9 | 33.2 | 481.2 | 0.069 | 34.1 | 0.9 |
| Invention Sample 10 | 1.3 | 31.8 | 481.8 | 0.066 | 32.6 | 0.8 |
| Invention Sample 11 | 1.3 | 33.6 | 400.0 | 0.084 | 34.5 | 0.9 |
| Invention Sample 12 | 1.2 | 34.5 | 507.4 | 0.068 | 35.9 | 0.3 |
| Invention Sample 13 | 1.2 | 28.4 | 364.1 | 0.078 | 28.7 | 1.4 |
| Invention Sample 14 | 2.0 | 32.0 | 450.7 | 0.071 | 32.7 | 0.7 |
| Invention Sample 15 | 1.0 | 31.4 | 455.1 | 0.069 | 32.3 | 0.9 |
| Comparative Sample 1 | — | 24.2 | 295.1 | 0.082 | 24.2 | 0.0 |
| Comparative Sample 2 | 0.4 | 32.2 | 536.7 | 0.060 | 32.4 | 0.2 |
| Comparative Sample 3 | 0.4 | 32.1 | 445.8 | 0.072 | 32.8 | 0.7 |
| Comparative Sample 4 | 1.2 | 31.5 | 484.6 | 0.065 | 31.5 | 0.0 |
| Comparative Sample 5 | 1.4 | 31.4 | 356.8 | 0.088 | 32.8 | 1.4 |
| Comparative Sample 6 | 1.2 | 32.2 | 473.5 | 0.068 | 32.9 | 0.7 |
| Comparative Sample 7 | 1.3 | 33.0 | 458.3 | 0.072 | 33.8 | 0.8 |
| Comparative Sample 8 | 1.1 | 32.1 | 401.3 | 0.080 | 32.8 | 0.7 |
| Comparative Sample 9 | 1.0 | 28.1 | 315.7 | 0.089 | 28.4 | 0.3 |
| Comparative Sample 10 | 1.4 | 31.4 | 352.8 | 0.089 | 31.6 | 0.2 |

Cutting Test

The resultant samples were subjected to a cutting test (milling) under the following condition to evaluate wear resistance and fracture resistance of the coated cutting tool.

Cutting Test Condition

Workpiece: FCD600.

Workpiece shape: Parallelepiped block having faces of 120 mm×400 mm.

Cutting speed: 200 m/min.

Cutting width: 60 mm.

Feed per tooth: 0.2 mm/tooth.

Depth of cut: 2.0 mm.

Coolant: used.

Evaluation items: Timing at which sample fractures occurred (chipping occurred in the cutting blade of a sample) or timing at which flank abrasion width reached 0.30 mm was defined as the end of a tool life, and machining length over the tool life was measured. The number of thermal cracks at a machining length of 3.0 m was obtained by SEM observation of the coated cutting tool used until the machining length reached 3.0 m. Results of such evaluation are listed in Table 4. In Table 4, a blank column of the "Number of thermal cracks at machining length of 3.0 m" refers to the fact that the evaluation was not conducted because the machining length was 3.0 m or less. A small value of the "Number of thermal cracks at machining length of 3.0 m" refers to the fact that thermal cracking was suppressed in cutting and wear resistance and high fracture resistance were superior. A large value of the "Machining length" refers to the fact that the coated cutting tool was able to withstand long-distance machining and fracture resistance and high wear resistance were superior.

TABLE 4

| Sample No. | Number of thermal cracks when machining length is 3.0 m | Machining length (m) |
|---|---|---|
| Invention sample 1 | 3 | 5.7 |
| Invention sample 2 | 4 | 10.4 |
| Invention sample 3 | 6 | 7.8 |
| Invention sample 4 | 9 | 5.9 |
| Invention sample 5 | 8 | 5.6 |
| Invention sample 6 | 3 | 7.2 |
| Invention sample 7 | 4 | 5.3 |
| Invention sample 8 | 6 | 10.0 |
| Invention sample 9 | 8 | 5.8 |
| Invention sample 10 | 6 | 8.8 |
| Invention sample 11 | 2 | 6.3 |
| Invention sample 12 | 7 | 7.1 |
| Invention sample 13 | 4 | 6.5 |
| Invention sample 14 | 5 | 9.8 |
| Invention sample 15 | 5 | 10.1 |
| Comparative sample 1 | — | 1.7 |
| Comparative sample 2 | 18 | 3.5 |
| Comparative sample 3 | 12 | 4.4 |
| Comparative sample 4 | 12 | 4.8 |
| Comparative sample 5 | 4 | 4.2 |
| Comparative sample 6 | 6 | 4.0 |
| Comparative sample 7 | 11 | 3.8 |
| Comparative sample 8 | 4 | 4.0 |
| Comparative sample 9 | 3 | 3.2 |
| Comparative sample 10 | 3 | 3.9 |

The results listed in Table 4 reveal that each invention sample has a longer machining length than any comparative sample and thus achieves suppression of thermal cracking. The coated cutting tool according to the present invention therefore has higher wear resistance and higher fracture resistance and thus has a longer tool life than in the related art.

The coated cutting tool according to the present invention has high wear resistance and high fracture resistance and thus has a longer tool life than in the related art, and is therefore industrially highly applicable.

REFERENCE SIGNS LIST

1 Coated cutting tool
2 Substrate
3 Coating layer
4 First compound layer
5 Second compound layer

What is claimed is:

1. A coated cutting tool comprising:
a substrate; and
a coating layer formed on a surface of the substrate, and the coated cutting tool having a rake face and a flank,
the coating layer comprising an alternating laminate structure in which first compound layers containing AlN and second compound layers containing a compound are laminated in an alternating manner, the compound having a composition represented by formula (1) below:

$$(Ti_{1-x}Al_x)N \qquad (1)$$

(wherein x denotes an atomic ratio of Al element to a total of Ti element and Al element and satisfies $0.40 \leq x \leq 0.70$),
an average thickness $T_1$ per first compound layer being 5 nm or more to 160 nm or less,
an average thickness $T_2$ per second compound layer being 8 nm or more to 200 nm or less,
a ratio ($T_1/T_2$) of the average thickness $T_1$ to the average thickness $T_2$ being 0.10 or more to 0.80 or less and the ratio ($T_1/T_2$) is constant with respect to every pair of first and second compound layers adjacent to each other throughout the entire coating layer,
an average thickness $T_3$ of the alternating laminate structure being 2.5 μm or more to 7.0 μm or less,
a ratio (H/E) of hardness H to elastic modulus E being 0.065 or more to 0.085 or less at the rake face or the flank.

2. The coated cutting tool according to claim 1, wherein hardness $H_2$ at the flank is higher than hardness $H_1$ at the rake face.

3. The coated cutting tool according to claim 2, wherein a difference ($H_2-H_1$) between the hardness $H_2$ and the hardness $H_1$ is 0.5 GPa or more to 1.5 GPa or less.

4. The coated cutting tool according to claim 3, wherein the second compound layers contain cubic crystals of (Ti, Al)N, and has a full width at half maximum of 0.5° or more to 2.0° or less of a diffraction peak of a plane (200) of the cubic crystals measured by X-ray diffraction measurement.

5. The coated cutting tool according to claim 3, wherein an average thickness $T_4$ of the coating layer is 2.5 μm or more to 9.0 μm or less, and
a ratio of the average thickness $T_3$ to the average thickness $T_4$ is 0.7 or more to 1.0 or less.

6. The coated cutting tool according to claim 3, wherein the hardness $H_1$ is 28.0 GPa or more to 35.0 GPa or less, and
the hardness $H_2$ is 28.5 GPa or more to 36.0 GPa or less.

7. The coated cutting tool according to claim 6, wherein the second compound layers contain cubic crystals of (Ti, Al)N, and has a full width at half maximum of 0.5° or more to 2.0° or less of a diffraction peak of a plane (200) of the cubic crystals measured by X-ray diffraction measurement.

8. The coated cutting tool according to claim 7, wherein an average thickness $T_4$ of the coating layer is 2.5 μm or more to 9.0 μm or less, and
a ratio of the average thickness $T_3$ to the average thickness $T_4$ is 0.7 or more to 1.0 or less.

9. The coated cutting tool according to claim 8, wherein the substrate is a cemented carbide, cermet, ceramics, or a cubic boron nitride sintered body.

10. The coated cutting tool according to claim 6, wherein an average thickness $T_4$ of the coating layer is 2.5 μm or more to 9.0 μm or less, and
a ratio of the average thickness $T_3$ to the average thickness $T_4$ is 0.7 or more to 1.0 or less.

11. The coated cutting tool according to claim 2, wherein the hardness $H_1$ is 28.0 GPa or more to 35.0 GPa or less, and
the hardness $H_2$ is 28.5 GPa or more to 36.0 GPa or less.

12. The coated cutting tool according to claim 11, wherein the second compound layers contain cubic crystals of (Ti, Al)N, and has a full width at half maximum of 0.5° or more to 2.0° or less of a diffraction peak of a plane (200) of the cubic crystals measured by X-ray diffraction measurement.

13. The coated cutting tool according to claim 11, wherein an average thickness $T_4$ of the coating layer is 2.5 μm or more to 9.0 μm or less, and
a ratio of the average thickness $T_3$ to the average thickness $T_4$ is 0.7 or more to 1.0 or less.

14. The coated cutting tool according to claim 2, wherein the second compound layers contain cubic crystals of (Ti, Al)N, and has a full width at half maximum of 0.5° or more to 2.0° or less of a diffraction peak of a plane (200) of the cubic crystals measured by X-ray diffraction measurement.

15. The coated cutting tool according to claim 2, wherein an average thickness $T_4$ of the coating layer is 2.5 μm or more to 9.0 μm or less, and a ratio of the average thickness $T_3$ to the average thickness $T_4$ is 0.7 or more to 1.0 or less.

16. The coated cutting tool according to claim 1, wherein the second compound layers contain cubic crystals of (Ti, Al)N, and has a full width at half maximum of 0.5° or more to 2.0° or less of a diffraction peak of a plane (200) of the cubic crystals measured by X-ray diffraction measurement.

17. The coated cutting tool according to claim 16, wherein an average thickness $T_4$ of the coating layer is 2.5 µm or more to 9.0 µm or less, and a ratio of the average thickness $T_3$ to the average thickness $T_4$ is 0.7 or more to 1.0 or less.

18. The coated cutting tool according to claim 1, wherein the coating layer comprises an upper layer on a surface of the alternating laminate structure on a side opposite to the substrate, the upper layer is a single or multiple compound layers of:

at least one element selected from the group consisting of Ti, Zr, Hf, V, Nb, Ta, Cr, Mo, W, Al, Si, and Y; and at least one element selected from the group consisting of C, N, O, and B, and an average thickness of the upper layer is 0.1 µm or more to 3.0 µm or less.

19. The coated cutting tool according to claim 1, wherein an average thickness $T_4$ of the coating layer is 2.5 µm or more to 9.0 µm or less, and a ratio of the average thickness $T_3$ to the average thickness $T_4$ is 0.7 or more to 1.0 or less.

20. The coated cutting tool according to claim 1, wherein the substrate is a cemented carbide, cermet, ceramics, or a cubic boron nitride sintered body.

21. The coated cutting tool according to claim 1, wherein the ratio $(T_1/T_2)$ is 0.10 or more to 0.70 or less.

* * * * *